United States Patent [19]

Penrod

[11] 4,060,847
[45] Nov. 29, 1977

[54] COOLING ARRANGEMENT FOR ELECTRICAL POWER CONTACTOR

[75] Inventor: John K. Penrod, Bellbrook, Ohio

[73] Assignee: Power Management Corporation, Dayton, Ohio

[21] Appl. No.: 666,164

[22] Filed: Mar. 11, 1976

[51] Int. Cl.² .......................................... H05K 7/20
[52] U.S. Cl. .................................. 361/387; 361/386; 200/289; 335/135; 174/16 HS
[58] Field of Search ............... 317/100; 174/16 HS; 200/289; 335/135; 361/386, 387, 388, 389

[56] References Cited

U.S. PATENT DOCUMENTS

| | | | |
|---|---|---|---|
| 2,284,644 | 6/1942 | Dubilier | 200/289 |
| 3,028,460 | 4/1962 | Turton | 317/100 |
| 3,328,642 | 6/1967 | Haumesser | 317/100 |
| 3,590,327 | 6/1971 | Thomas | 317/100 |
| 3,699,394 | 10/1972 | Schuler | 317/100 |
| 3,769,551 | 10/1973 | Corman | 200/289 |
| 3,895,267 | 7/1975 | Gordon | 317/100 |

*Primary Examiner*—Gerald P. Tolin
*Attorney, Agent, or Firm*—Biebel, French & Nauman

[57] ABSTRACT

A power contactor device includes at least one power relay contained within an electrically insulating plastic housing. Electrical busses carrying current to the relay contacts also serve as a means for removing the heat generated by those contacts and other electrical components within the housing. On the exterior of the housing, the busses have a large surface area and transfer heat through electrically insulating but thermal conducting material, such as alumina or beryllium filled epoxy, to a heat sink. The core of the relay is in metal-to-metal contact with the heat sink.

4 Claims, 6 Drawing Figures

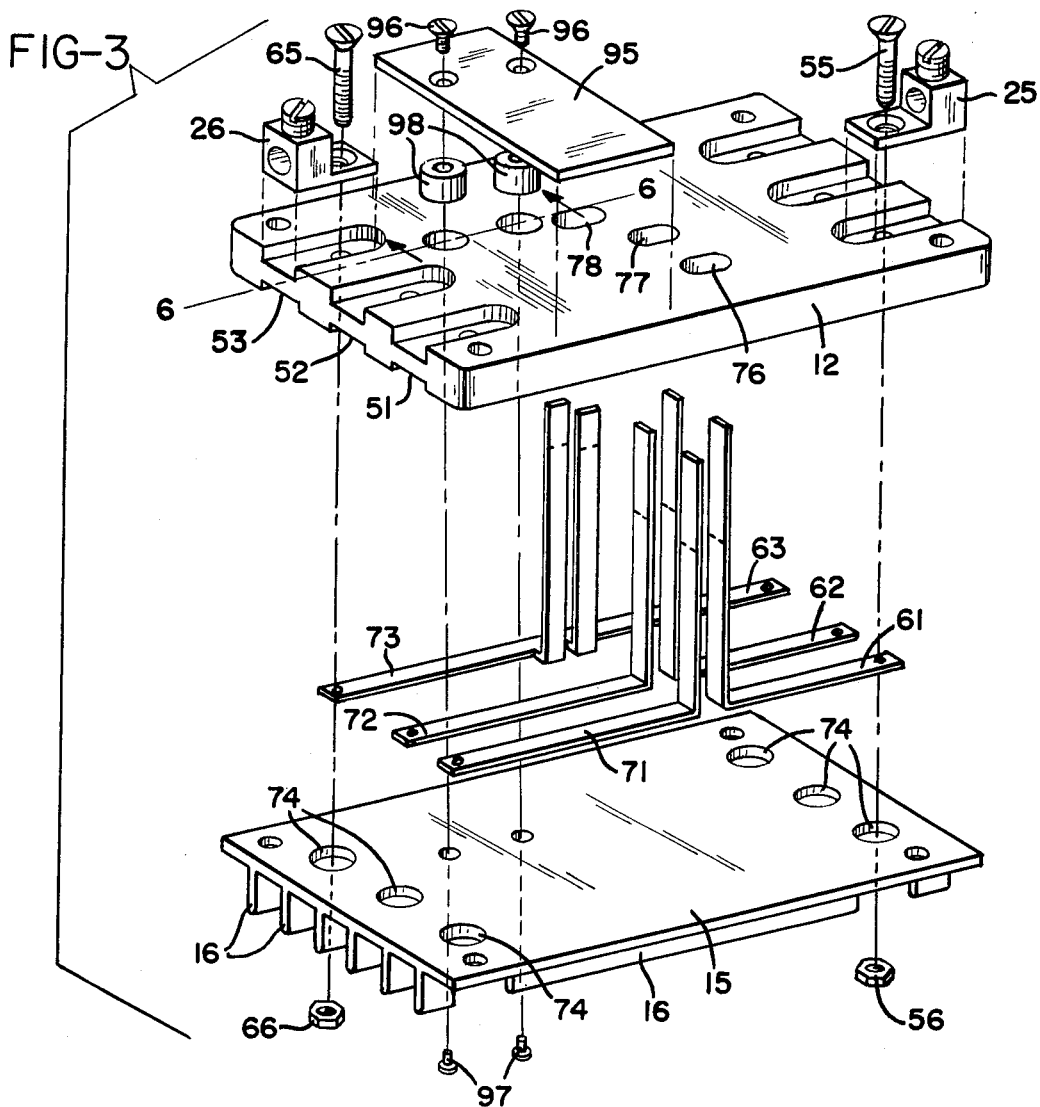
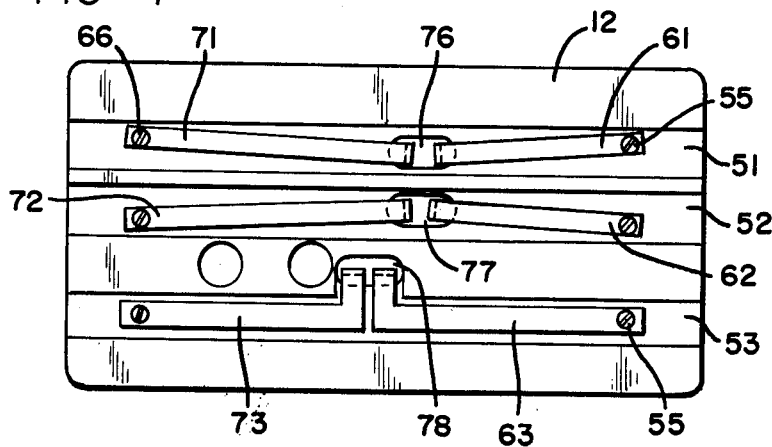

4,060,847

COOLING ARRANGEMENT FOR ELECTRICAL POWER CONTACTOR

BACKGROUND OF THE INVENTION

The present invention relates to an electrical power contactor device included within a sealed housing and including heat transfer means for efficiently removing heat generated within the housing.

Electrical contactor devices, especially those carrying high currents, will generate heat primarily at the contacts and also within the fingers and wires leading to those contacts. These relay devices are normally contained within a protective housing to prevent inadvertent contact with the exposed electrical components, and it is preferred that the housing be sealed to prevent contaminates from interfering with the operation of the relay and the proper seating of the contacts.

Industry standards, such as those established by the National Electrical Manufacturers Association (NEMA) and others, limit the permissible temperature rise within the housing, therefore some means must be devised to remove the heat generated from within the housing to maintain the temperature within acceptable limits.

Various techniques for cooling electrical devices are shown in U.S. Pat. Nos. 2,990,497; 3,317,796; and 3,359,461.

SUMMARY OF THE INVENTION

This invention relates to an electrical power contactor device which is contained within an electrically insulating sealed housing which includes means for removing heat from the interior of the housing.

In the present invention, the housing is preferably made from an electrically insulating material, such as a molded plastic to facilitate fabrication and to lower manufacturing costs; however, molded plastics generally are poor conductors of heat.

The present invention utilizes the electrical lead wires or busses which extend from exteriorly mounted terminal posts into the interior of the housing where they are electrically connected to the contactor device. These busses not only provide the means for carrying electrical current through the device, but they are also used to remove the heat from the interior of the housing.

The heat generated by an electrical contactor is primarily the result of the resistance between the contacts. Some heat is also generated due to the resistance of the contact fingers and the lead wires or busses. Other components, such as the windings of the contactor or relay coil and other electrical components within the housing will also contribute to the generation of heat.

One industry standard requires that the temperature rise within the housing be limited to not more than a 65° C. rise above ambient under the full rated load capacity of the contactor. To accomplish this with a sealed enclosure, the present invention utilizes the electrical busses extending between the external terminals and the interior of the housing as the heat transfer medium. These busses are electrically and thermally connected to the primary source of heat and have a large surface area on the exterior of the housing to effectively transfer the heat to a heat sink. The heat transfer is accomplished through an electrically insulating but thermally conducting material, such as a heat conducting alumina or beryllium filled epoxy.

In the present invention, the busses on the exterior of the housing are positioned within recesses formed in the housing, and a thin layer of electrically insulating but heat conducting epoxy is applied to the busses. The surface area of the busses is large enough to remove the heat effectively, even though the heat transfer through the epoxy is less than that which would be available with metal-to-metal contact. Nevertheless, the busses are electrically insulated by the epoxy and can thus serve a dual function.

This invention therefore relates to an apparatus having a housing means containing electrical components some of which produce heat during operation. Electrical and thermal conducting elements, such as busses, extend into the housing to carry electrical current to the components and to transfer the heat generated within the housing to the exterior thereof to maintain the temperature rise within acceptable limits. The elements have a large, generally flat surface area on the outside of the housing to provide effective heat transfer to a heat sink device, such as an aluminum or copper plate having a plurality of fins extending therefrom. A thermally conductive but electrically insulating material such as epoxy, is placed between the electrical and thermal conducting elements and the heat sink means to permit heat transfer while maintaining electrical isolation.

Accordingly, it is an object of this invention to provide an improved electrical contactor device of the type described utilizing the electrical busses which extend into a housing and which are in electrical and thermal contact with the components within that housing. The busses have a large surface area on the exterior of the housing and electrically insulative but thermally conductive material is interposed between the busses and heat sink means.

Other objects and advantages of the invention will be apparent from the following description, the accompanying drawings and the appended claims.

BRIEF DESCRIPTION OF THE DRAWINGS

FIG. 3 is an exploded perspective view of a portion of the contactor showing the relationship between the contactor base, the heat sink, and the several electrical busses which extend into the interior of the contactor housing and through which heat is removed from the housing;

FIG. 4 is a bottom plan view of the contactor base, without the heat sink, showing the busses installed within the slots formed in the base;

DESCRIPTION OF THE PREFERRED EMBODIMENT

Figure 1:
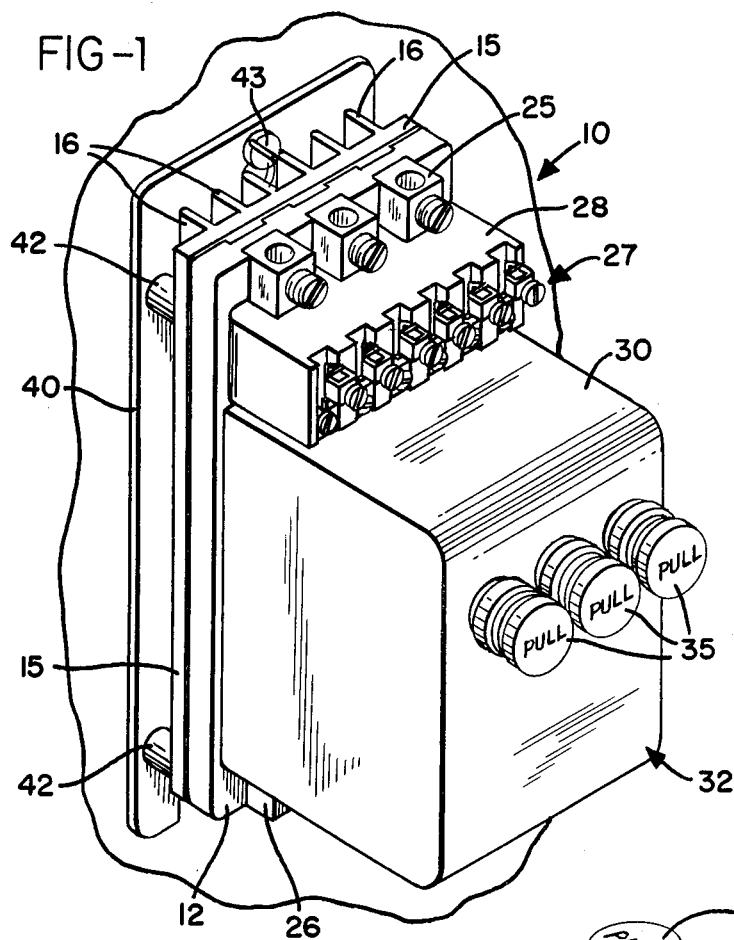
FIG. 1 is a perspective view showing an electrical contactor or relay mounted for use.

Reference is now made to the drawings, and particularly to FIG. 1 which shows an electrical contactor device 10 comprising an insulative base member 12, a heat sink 15 secured to the base member and including a plurality of heat radiating fins 16, a plurality of main terminals 25 and 26, auxiliary terminals 27 mounted on an insulative member 28, and a cover 30. The base member 12 and the cover 30 are preferably formed from electrically insulating molded plastic and form a housing 32 in which are mounted one or more power contactors or relays and associated electrical control circuits.

In the embodiment shown in FIG. 1, the electrical contactor device is for use in controlling current through a three wire or three phase alternating current circuit; and the control circuitry is therefore divided among three plug-in modules 35 which may be inserted through openings in the cover 30. The contactor device 10 is secured to but spaced from a mounting plate 40 by spacers 42; and the mounting plate may be secured to a suitable surface, such as a wall of a control cabinet, by a mounting screw 43.

Figure 2:
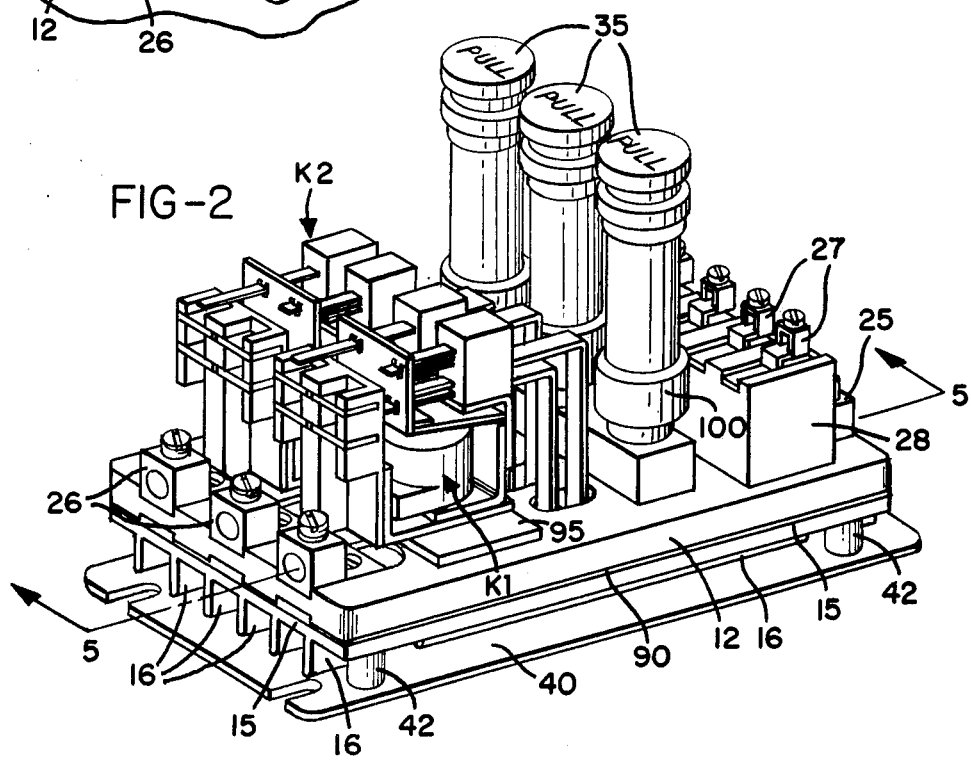
FIG. 2 is a perspective view of the electrical contactor of FIG. 1 with the cover removed.

As shown in FIG. 2, two electrical contactor devices are contained within the housing 32. The first contactor device K1, is the main power contactor and is used to transfer power from terminals 25 mounted at the right end to terminals 26 mounted at the opposite end of the base member. For a three wire system, relay K1 will include at least three power switching contacts; and it might also include two auxiliary relay contacts for controlling arc suppression and protection circuits as described in my copending application Ser. No. 666,152, filed on Mar. 11, 1976, now U.S. Pat. No. 4,025,820, issued May 24, 1977. Relay K2 is an auxiliary relay which might serve to control the protection circuit described in the above mentioned application.

As shown in FIGS. 3 and 4, the base member 12 has formed therein three longitudinally extending slots 51, 52 and 53. In the embodiment shown, these slots are milled into the bottom of the base member; however, they may also be formed therein by injection molding, if desired. The depth to which these slots are formed is slightly greater than the thickness of the electrical buss bars carried therein.

Each of the terminals 25 is connected by a bolt 55 and nut 56 to its respective buss bars 61, 62 and 63. Similarly, terminal 26 is electrically connected by means of bolt 65 and nut 66 to buss bars 71, 72 and 73. The heat sink is provided with openings 74 permitting the nuts 56 and 66 to be installed without making electrical contact therewith.

As may be seen in FIGS. 3 and 4, buss bars 61 and 71 extend longitudinally from their respective terminals within slot 51 and are then directed upwardly through opening 76 in the base 12. Likewise, busses 62 and 72 extend through openings 77, while busses 63 and 73 extend through opening 78.

Figure 5:
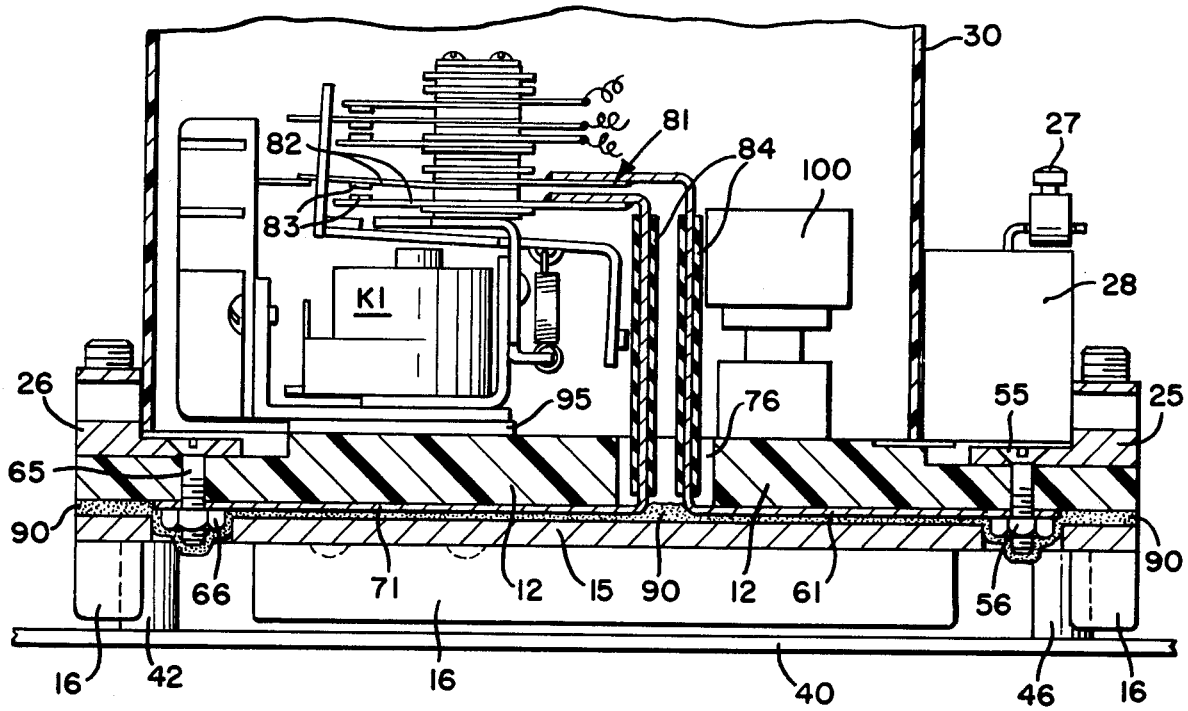
FIG. 5 is a cross sectional view of the contactor taken along lines 5—5 in FIG. 2.
Figure 6:
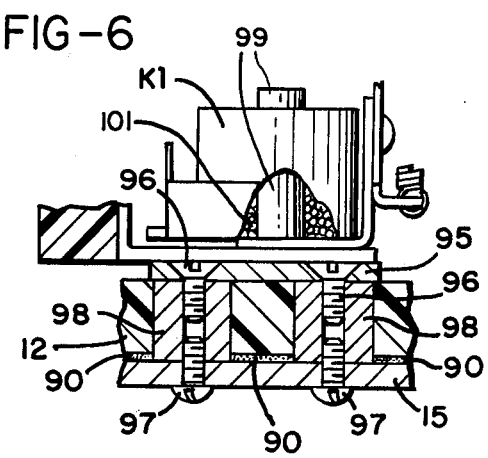
FIG. 6 is a cross sectional view taken along lines 6—6 in FIG. 3 showing the mechanism for removing heat directly from the relay coil.

On the upper side of the base 12, the busses are bent and secured to their respective contacts of relay K1. As shown in FIG. 5, relay contacts 81 include a pair of fingers 82 and contact members 83. The busses 61 and 71 are attached to the terminal end of the fingers 82 by soldering or other suitable means. The busses are thus in electrical and thermal contact with the relay contacts 81 and are capable of removing any heat generated within the fingers 82 or between the contact members 83 when current passes therethrough. The busses 61 and 71 may be provided with an insulating sleeve or coating 84 to protect against inadvertent contact therewith and a possible short circuit. Similarly, busses 62 and 72 are connected to a second set of switch contacts and busses 63 and 73 are connected to a third set of contacts on relay K1.

The space between the bottom of the busses 61-63, 71-73 and the heat sink 15 is filled with a thermally conductive but electrically insulating material 90 such as an alumina or beryllium filled epoxy. One epoxy material which has been used satisfactorily is manufactured by Emerson and Cummings and is identified as No. 2850FT. This epoxy has an electrically insulative characteristic of 600 volts per mill, and therefore it is necessary only that this material be thick enough to provide the desired electrical insulating characteristics, depending upon the voltage rating of the contactor.

The depth of the slots 51-53 therefore must be great enough to accept the busses 61-63 and 71-73, any variation in the thickness or flatness of the busses and provide the necessary thickness of epoxy in order that at least the desired electrical insulating characteristics are obtained. Adequate thermal conductivity is provided the large surface area presented by the busses 61-63 and 71-73 between the openings 76-78 and their terminal ends. In one embodiment, the busses are 0.375 inch wide and have a total surface area of approximately 6.3 square inches presented to the heat sink 15.

The relays K1 and K2 are secured to a mounting plate 95, and this plate in turn is connected thermally and electrically to the heat sink 15 by means of screws 96 and 97 and heat conductive metal plugs 98. This provides a metal-to-metal thermal path from the core member 99 of the relay to the heat sink 15.

Also contained within the housing 32 are electrical sockets 100 which receive the plug-in modules 35; however, it may be desired in some cases to place these electrical control circuits on the exterior of the housing.

The heat generated within the housing 32 due to the heating of the electrical windings 101 surrounding the coils of the relays K1 and K2 and the current passing through the relay contacts and fingers along with the busses carrying current to those contactors is not effectively radiated from the cover 30 but is removed by means of the busses 61-63 and 71-73. By providing the busses with large cross sectional areas, the heat generated within the busses itself is reduced, and since the busses have large surface areas, both within and without the enclosure, and since the busses are in direct thermal contact with the fingers of the relay, it allows the busses to receive the heat within the enclosure and to effectively dissipate that heat through the thermally conductive epoxy 90 to the heat sink 15 where it may be radiated by the fins 16 in the conventional manner, such as by convection. The temperature within the housing of an electrical contactor built according to this invention carrying a full rated load of 50 amps. while limiting the temperature rise within the housing to no more than 65° C.

While the form of apparatus herein described constitutes a preferred embodiment of this invention, it is to be understood that the invention is not limited to this precise form of apparatus, and that changes may be made therein without departing from the scope of the invention which is defined in the appended claims.

What is claimed is:
1. Electrical apparatus including
   a housing containing electrical components some of which produce heat during operation, said housing including a cover member and a base member having a top surface on which is mounted said cover member and a bottom surface;
   electrical connection means mounted on said housing,
   means forming at least one elongated recess in the bottom of said base member;

at least one electrically and thermally conducting element having a portion thereof extending into the interior of said housing where it is in electrical and thermal contact with said electrical components and another portion thereof extending from said housing through said recess to said electrical connection means; and thermally conductive but electrically insulative means filling said recess between said element and the bottom surface of said base member whereby the bottom surface of said base member may be placed in contact with heat sink means and the heat carried by said element dissipated into said heat sink means without electrical contact therewith.

2. The electrical apparatus of claim 1 further including heat sink means mounted to said base member and in thermal contact with said thermally conductive but electrically insulative means, said heat sink means including a plurality of fins to dissipate heat therefrom, said electrical apparatus including therein at least one relay having an electrical winding surrounding a core member, and means for providing a metal-to-metal path from said core member to said heat sink means to transfer heat thereinto.

3. The electrical apparatus of claim 1 wherein said housing means is formed from molded plastic.

4. Electrical apparatus including a housing containing electrical components some of which produce heat during operation, said housing including a cover member and a base member having a top surface on which is mounted said cover member and a bottom surface;

electrical connection means mounted on said housing, means forming at least one elongated recess in the bottom of said base member;

at least one electrically and thermally conductive element having a portion thereof extending into the interior of said housing where it is in electrical and thermal contact with said electrical components and another portion thereof extending from said housing through said recess to said electrical connection means;

said element having a large, flat surface area on the outside of said housing to more effectively dissipate heat therefrom;

thermally conductive but electrically insulative means filling said recess between said element and the bottom surface of said base member;

heat sink means mounted to the bottom surface of said base member and in thermal contact with said thermally conductive but electrically insulative means whereby the heat carried by said element is dissipated into said heat sink means without electrical contact therewith;

said heat sink means including a plurality of fins to dissipate heat therefrom to the atmosphere;

said electrical apparatus including therein at least one relay; and means for providing a metal-to-metal path from said relay to said heat sink means to transfer heat thereinto.

* * * * *